US005204827A

United States Patent [19]

Fujita et al.

[11] Patent Number: 5,204,827

[45] Date of Patent: Apr. 20, 1993

[54] SAMPLING RATE CONVERTING APPARATUS

[75] Inventors: Tadao Fujita, Kanagawa; Jun Takayama, Tokyo; Takeshi Ninomiya, Kanagawa, all of Japan

[73] Assignee: Sony Corporation, Tokyo, Japan

[21] Appl. No.: 768,243

[22] PCT Filed: Feb. 14, 1991

[86] PCT No.: PCT/JP91/00175

§ 371 Date: Oct. 15, 1991

§ 102(e) Date: Oct. 15, 1991

[87] PCT Pub. No.: WO91/12664

PCT Pub. Date: Aug. 22, 1991

[30] Foreign Application Priority Data

Feb. 16, 1990 [JP] Japan .................................... 2-35614

[51] Int. Cl.[5] ............................................ G06F 15/31

[52] U.S. Cl. ............................ 364/724.1; 364/724.16

[58] Field of Search ......................... 364/724.1, 724.16

[56] References Cited

U.S. PATENT DOCUMENTS

| | | | |
|---|---|---|---|
| 3,997,773 | 12/1976 | Essen et al. | 364/724.1 |
| 4,020,332 | 2/1977 | Crechlere et al. | 364/724.1 |
| 4,584,659 | 4/1986 | Stikvoort | 364/724.1 |
| 4,604,720 | 8/1986 | Stikvoort | 364/724.1 |
| 5,111,417 | 5/1992 | Belloc et al. | 364/724.1 |

FOREIGN PATENT DOCUMENTS

| | | |
|---|---|---|
| 0305864 | 3/1989 | European Pat. Off. . |
| 3605927 | 8/1987 | Fed. Rep. of Germany . |
| 2180114 | 3/1987 | United Kingdom . |

*Primary Examiner*—David H. Malzahn

*Attorney, Agent, or Firm*—William S. Frommer; Alvin Sinderbrand

[57] ABSTRACT

A sampling rate converting apparatus is arranged in such a manner that, in a case where the frequency ratio of a first or a second sampling frequency holds a simple integral relationship, its oversampling filters are composed of FIR type digital filters the length of each of which corresponds to the least common multiple of the frequency ratio so that the first or the second sampling frequency of the digital signal is converted into the second or the first sampling frequency.

A sampling rate converting apparatus is arranged in such a manner that coefficients to be given to weighting means of oversampling filters are changed by selecting coefficient data of coefficient generating means including a plurality of selectable coefficient data so that, in a case where the frequency ratio of the first or the second sampling frequency does not hold a simple integral relationship, the first or the second sampling frequency of the digital signal can be converted into the second or the first sampling frequency.

8 Claims, 6 Drawing Sheets

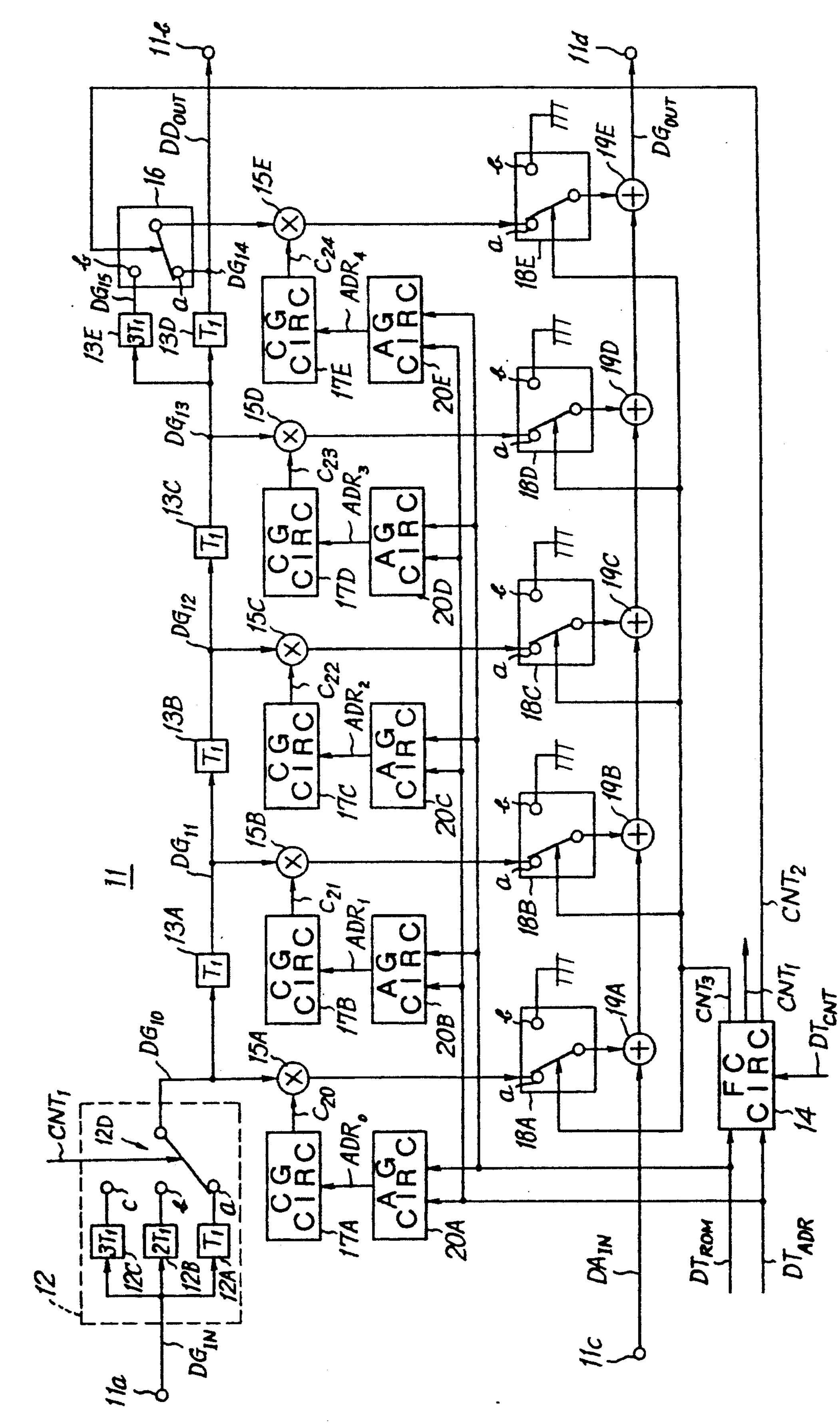
F I G. 4

SAMPLING RATE CONVERTING APPARATUS

TECHNICAL FIELD

The present invention relates to a sampling rate converting apparatus, and, more particularly, to a structure capable of converting the sampling frequency of a digital signal composed of a first or a second sampling frequency into the second or the first sampling frequency.

BACKGROUND ART

Hitherto, a sampling rate converting apparatus formed into a digital filter structure has been used for the purpose of sampling an analog signal at a predetermined sampling frequency and converting a digital signal thus-obtained into an arbitrary sampling frequency.

In general, a sampling rate converting apparatus of the type described above is constituted by a high-order oversampling filter for the purpose of strictly securing the Nyquist frequency as the conversion characteristics of its transmission system.

In a case where, for example, the sampling frequency of a 625/50 component digital video signal formed in accordance with the D-1 format for a digital video tape recorder (DVTR) is, by using a sampling rate converting apparatus of the type described above, converted into a sampling frequency, which corresponds to a PAL composite digital video signal formed in accordance with the D-2 format, the sampling frequency cannot directly be converted between the digital video signals because the rate of the sampling frequency is converted from a frequency of 13.5 [MHz] into a frequency of 17.734475 [MHz]. Therefore, an oversampling filter having a length of about 16500 orders must be constituted for approximation.

On the contrary, when the sampling frequency of a PAL composite digital video signal is converted into a sampling frequency which corresponds to a 625/50 component digital video signal, an exclusive oversampling filter of the equivalent circuit size to that of the above-described structure must be constituted in order to convert the rate of the sampling frequency from a frequency of 17.734475 [MHz] to a frequency of 13.5 [MHz]. Therefore, each of the structures must include an exclusive circuit as a whole. As a result, there arises a problem in that the circuit structure becomes too complicated and the size becomes too large. Disclosure of the Invention.

In view of the prior art, an object of the present invention is to provide a sampling rate converting apparatus capable of converting the sampling frequency of a digital signal composed of a first or a second sampling frequency into the second or the first sampling frequency, that is, capable of converting the sampling rate in two opposing directions.

In order to overcome the above-described problems, according to a first aspect of the present invention, a sampling rate converting apparatus 1 for converting a digital signal DIN which is sampled by a first or a second sampling frequency f1 or f2 into the second or the first sampling frequency f2 or f1, the frequency ratio of which holds a simple integral relationship, at the first or the second sampling frequency f1 or f2, the sampling rate converting apparatus comprising: oversampling filters 2A to 2K, 3A to 3L and 4A to 4K composed of FIR type digital filters the length of each of which corresponds to the least common multiple of the frequency ratio of the first and the second sampling frequencies f1 and f2, wherein the first or the second sampling frequency f1 or f2 of the digital signal DIN is converted into the second or the first sampling frequency f2 or f1.

According to a second aspect of the present invention, there is provided a sampling rate converting apparatus 10 for converting a digital signal SIN10 which is sampled by a first or a second sampling frequency into the second or the first sampling frequency, the sampling rate converting apparatus comprising: oversampling filters 11A, 11B, 11C and 11D composed of FIR type digital filters the length of each of which corresponds to the least common multiple of the frequency ratio of the first and the second sampling frequencies; coefficient generating means 17A, 17B, 17C, 17D and 17E including a plurality of selectable coefficient data items, and giving coefficients C20, C21, C22, C23 and C24, which corresponds to the selected coefficient data, to weighting means 15A, 15B, 15C, 15D and 15E of the oversampling filters 11A, 11B, 11C and 11D, wherein when the first or the second sampling frequency of the digital signal SIN10 is converted into the second or the first sampling frequency in a case where the frequency ratio of the first or the second sampling frequency does not hold a simple integral relationship, the coefficient data of the coefficient generating means 17A to 17E is selected in accordance with a direction of the conversion.

Furthermore, coefficients C20 to C24 to be given to weighting means 15A to 15E of oversampling filters 11A to 11D are changed by selecting coefficient data of coefficient generating means 17A to 17E including a plurality of selectable coefficient data so that, in a case where the frequency ratio of the first or the second sampling frequency does not hold a simple integral relationship, the first or the second sampling frequency of the digital signal SIN10 can be converted into the second or the first sampling frequency.

BRIEF DESCRIPTION OF DRAWINGS

FIG. 4 is a block diagram which illustrates the structure of an oversampling filter;

BEST MODE FOR CARRYING OUT THE INVENTION

A first mode of the present invention will now be described with reference to the drawings.

(1) First Mode

Figure 1:
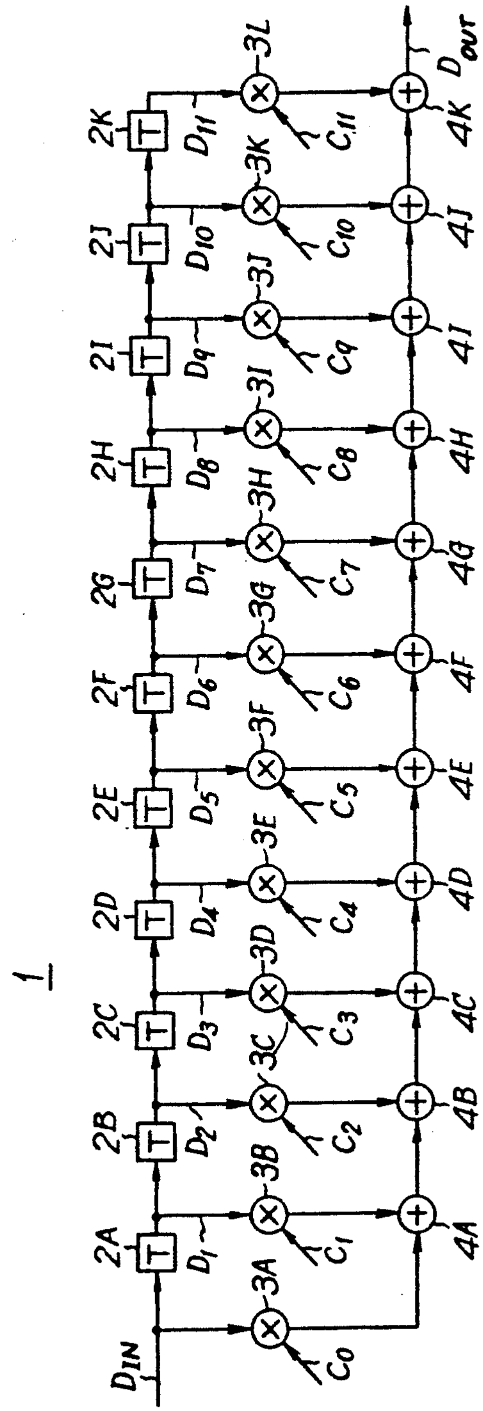
FIG. 1 is a block diagram which illustrates a first mode of a sampling rate converting apparatus.

FIG. 1 illustrates a sampling rate converting apparatus capable of converting the sampling frequency in two opposing directions (that is, capable of reversibly converting the same between a first and a second sampling frequencies). For example, the frequency ratio of first and second frequencies f1 and f2 of a digital signal, that is, f1/f2 the sampling ratio of which must be converted, is set to 4:3, that is, a numerator of 4 and a denominator of 3. Thus, the sampling frequency can reversibly be converted in a direction from digital signal S1 composed of the first sampling frequency f1 toward digital signal S2 composed of the second sampling frequency f2 or in the reverse direction of the above-described direction.

Referring to FIG. 1, in order to obtain desired frequency characteristics including Nyquist characteristics when the sampling frequencies f1 and f2 are converted to each other between the first and the second digital signals S1 and S2, the sampling rate converting apparatus 1 is constituted by an oversampling filter arranged to have an order which is the product of the numerator and denominator of the frequency ratio of the sampling frequencies f1 and f2 of the first and the second digital signals S1 and S2.

The sampling rate converting apparatus 1 is constituted by a so-called FIR (finite impulse response) type digital filter to which the first digital signal S1 is, as input digital signal DIN, supplied when the sampling frequency f1 of the first digital signal S1 is rate-converted into the second sampling frequency f2 to obtain the second digital signal S2.

In a case according to this mode, the sampling rate converting apparatus 1 comprises a 12-order FIR type digital filter which is operated at an oversampling frequency of 3f1 (=4f2). The order of the filter is based on its number of delay elements. It is composed of a series circuit having 11 flip-flops or delay elements 2A to 2K each of which has a delay time of T. The delay time T of each of the flip-flops 2A to 2K is determined to a value expressed by the following equation:

$$T = \frac{1}{12 \times 3f_1} = \frac{1}{12 \times 4f_2} \quad (1)$$

The input digital signal DIN and output digital signals D1 to D11 from the corresponding flip-flops 2A to 2K are respectively supplied to weighting means composed of 12 multiplying circuits 3A to 3L.

In a case where the sampling frequency is rate-converted from the first sampling frequency f1 into the second sampling frequency f2, the first, the fourth, the seventh and the tenth multiplying circuits 3A, 3D, 3G and 3J are respectively given predetermined coefficients c0, c3, c6 and c9, while the other multiplying circuits 3B, 3C, 3E, 3F, 3H, 3I, 3K and 3L are respectively given coefficients c1, c2, c4, c5, c7, c8, c10 and c11 the value of each of which is "0".

Thus, the input digital signal DIN supplied to the first, the fourth, the seventh and the tenth multiplying circuits 3A, 3D, 3G and 3J and the output digital signals D3, D6 and D9 from the third, the sixth and the ninth flip-flops 2C, 2F and 2I are respectively multiplied by the predetermined coefficients c0, c3, c6 and c9. Then, the results of all of the multiplications are added to one another by using adder circuits 4A to 4K.

As a result, the input digital signal DIN can be oversampled at an oversampling frequency of 3f1 which is three times the first sampling frequency f1 and as well as it can be resampled at a frequency which is $\frac{1}{4}$ of the same. Therefore, the second digital signal S2 composed of the second sampling frequency f2 can be transmitted as output digital signal DOUT.

On the other hand, when the first digital signal S1 is obtained by converting the sampling rate of the sampling frequency f2 of the second digital signal S2 into the first sampling frequency f1, the second digital signal S2 is supplied as the input digital signal DIN.

In this case, the first, the fifth and the ninth multiplying circuits 3A, 3E and 3I are respectively given predetermined coefficients c0, c4 and c8, while the other multiplying circuits 3B, 3C, 3D, 3F, 3G, 3H, 3J, 3K and 3L are respectively given coefficients c1, c2, c3, c5, c6, c7, c9, c10 and c11 the value of each of which is "0".

Thus, the input digital signal DIN supplied to the first, the fifth and the ninth multiplying circuits 3A, 3E and 3I and the output digital signals D4 and D8 from the fourth and the eighth flip-flops 2D and 2H are respectively multiplied by the predetermined coefficients c0, c4 and c8. Then, the results of all of the multiplications are added to one another by using adder circuits 4A to 4K.

As a result, the input digital signal DIN can be oversampled at an oversampling frequency of 4f2 which is four times the second sampling frequency f2 and as well as it can be resampled at a frequency which is $\frac{1}{3}$ of the same. Therefore, the first digital signal S1 composed of the first sampling frequency f1 can be transmitted as output digital signal DOUT.

Figure 2:
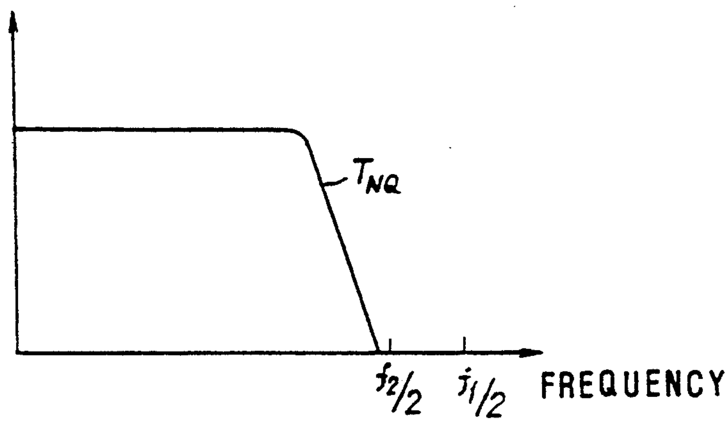
FIG. 2 is a characteristic graph which illustrates the Nyquist characteristics of the same.

In the structure shown in FIG. 1, in the case where the oversampling rate is converted in either direction, the oversampling frequency has a relationship of a least common multiple of the first and the second sampling frequencies f1 and f2. Therefore, in both cases where the rate is converted from the first sampling frequency f1 into the second sampling frequency f2 and where the rate is converted from the second sampling frequency f2 into the first sampling frequency f1, the sampling rate converting apparatus is, as shown in FIG. 2, able to have the same Nyquist characteristics TNQ at the Nyquist frequencies (f1/2 and f2/2) which are required in the corresponding cases.

The above-described structure is arranged in such a manner that the FIR type digital filters 2A to 2K, 3A to 3L and 4A to 4K which correspond to the least common multiple of the first and the second sampling frequencies f1 and f2 are used to perform the rate conversions in accordance with the oversampling method. Therefore, the sampling rate converting apparatus 1 capable of converting the rate in two opposing directions between the first and the second sampling frequencies f1 and f2 can be realized.

(2) Second Mode (2-1) Principle of Converting Sampling-Rate According to Second Mode The sampling rate converting apparatus according to a second mode rate-converts the sampling frequency of a 625/50 component digital video signal formed in accordance with the D-1 format into a sampling frequency which corresponds to a PAL composite digital video signal formed in accordance with the D-2 format. Furthermore, it rate-converts the sampling frequency of the PAL composite digital video signal into a sampling frequency which corresponds to the 625/50 component digital video signal.

The sampling frequency fD1 of the 625/50 component digital video signal formed in accordance with the D-1 format is specified to be a frequency of 13.5 [MHz]. Therefore, the number of samples of the digital video signal per line is 864, causing the total number of samples per frame to be 540000.

Sampling frequency fD2 of the PAL composite digital video signal formed in accordance with the D-2 format is 17.734475 [MHz] which is four times the frequency of the carrier wave calculated in accordance with the following equation while letting horizontal frequency fh be a frequency of 15.625 [KHz]:

$$f_{sc} = \left(284 - \frac{1}{4}\right)f_h + \frac{50}{2} \tag{2}$$
$$= 4.43361875 \text{ [MHz]}$$

Therefore, the number of samples of the digital video signal per line is 1135.0064, causing the total number of samples per frame to be 709379.

As described above, the ratio of the number of the samples of the 625/50 component digital video signal per line and that of the PAL composite digital video signal per line is 864:1135.0064. Therefore, a fact can be understood that a simple integer relationship does not exist.

As a result, a long oversampling filter of 16500-order must necessarily be employed in the conventional structure.

On the other hand, the sampling rate converting apparatus according to the second mode is arranged in such a manner that an oversampling filter of a length of, for example, 4554-order is constituted for approximation from the above-described ratio of the number of samples. More specifically, approximate oversampling frequency factors of 506 and 414 for D1 and D2 signals are used, since 506fD1 is approximately equal to 414fD2. The least common multiple of the approximate oversampling frequencies, 4554=(506)(9)=(414)(11), is chosen as the order of the oversampling filter. A result, the sampling rate can be converted in the two opposing directions.

That is, in a case where the sampling frequency of the 625/50 component digital video signal is converted into a sampling frequency which corresponds to the PAL composite digital video signal, oversampling is performed at a frequency which is 506 times the sampling frequency fD1 (=13.5 [MHz]) before resampling is performed at a frequency which is 1/414 times the same.

In the contrary case where the sampling frequency of the PAL composite digital video signal is converted into a frequency which corresponds to the 625/50 component digital video signal, oversampling is performed at a frequency which is 414 times the sampling frequency fD2 (=17.734475 [MHz]) before resampling is performed at a frequency which is 1/506 times the same.

As a result, the oversampling frequencies become frequencies of 6381 [MHz] and 7342.04 [MHz]. Therefore, a result can be obtained in that the Nyquist characteristics realized due to the oversampling frequency generate a practically sufficiently small difference of about 7 [%].

Therefore, since the sampling rate converting apparatus according to the second mode is arranged to have the Nyquist frequency set to a frequency with which no problem takes place practically. As a result, the rate of the sampling frequency can reliably be converted in the two opposing directions between the 625/50 component digital video signal and the PAL composite digital video signal while further simplifying its structure.

(2-2) Structure of Oversampling Filter

Figure 3:
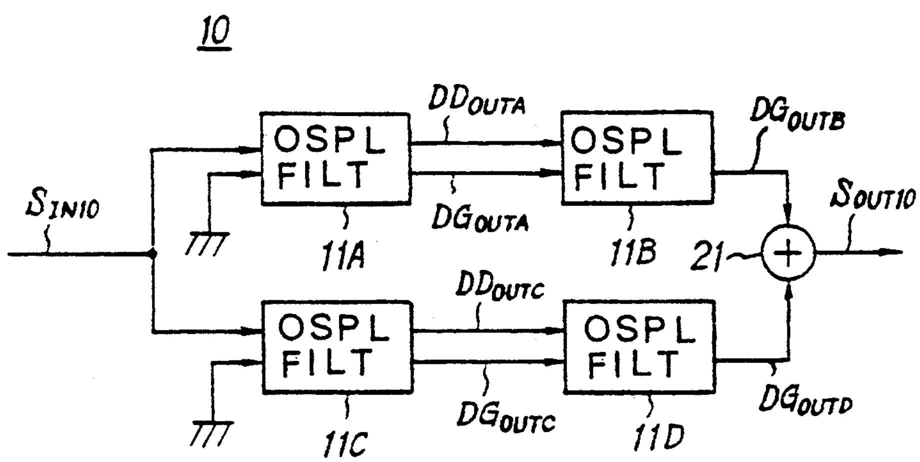
FIG. 3 is a block diagram which illustrates a second mode of the sampling rate converting apparatus.

Referring to FIG. 3, reference numeral 10 represents the overall body of a sampling rate converting apparatus for converting the sampling rate in the two opposing directions between the 625/50 component digital video signal and the PAL composite digital video signal in accordance with the above-described principle. According to this mode, it is composed by combining four oversampling filters 11 (11A, 11B, 11C and 11D) each of which is formed into an integrated circuit.

In actual fact, each of the oversampling filters 11 (11A to 11D) can, as shown in FIG. 4, be constituted by the FIR type digital filter the length of which is 5-order or shorter. Digital signal DGIN supplied through a first input terminal 11*a* thereof is, via a delay input selection circuit 12, supplied to a series circuit comprising the first, the second, the third and the fourth flip-flops 13A, 13B, 13C and 13D each of which has predetermined delay time T1.

The delay input selection circuit 12 has flip-flops 12A, 12B and 12C respectively having delay time T1, delay time 2T1 which is two times the former, and delay time 3T1 which is three times the same. Therefore, the digital signal DGIN is delayed by each of predetermined time periods when it passes through the flip-flops 12A, 12B and 12C. Then, delay outputs are respectively supplied to a first, a second and a third input terminals a, b and c of a switch circuit 12D.

In the above-described switch circuit 12D, a selection from the first to the third input terminals a to c is made in accordance with selection control signal CNT1 supplied to a filter control circuit 14. As a result, the input digital signal DGIN is delayed by a delay time in accordance with the control operation performed by the filter control circuit 14. Delay digital signal DG10 obtained as a result of this is transmitted to the ensuing first flip-flop 13A and is also supplied to the first multiplying circuit 15A.

Furthermore, delay digital signals DG11, DG12 and DG13 respectively transmitted from the first, the second and the third flip-flop 13A, 13B and 13C are transmitted to the ensuing second, the third and the fourth flip-flops 13B, 13C and 13D and also are supplied to a second, a third and a fourth multiplying circuits 15B, 15C and 15D.

Delay digital signal DG14 transmitted from the fourth flip-flop 13D is transmitted via a first output terminal 11*b* as output delay digital signal DDOUT of the overall body of the oversampling filter 11. Furthermore, it is supplied to a first input terminal a of a delay quantity selection circuit 16.

The delay digital signal DG13 transmitted from the third flip-flop 13C is also supplied to a flip-flop 13E the delay time of which is 3T1, which is three times the delay time of the above-described flip-flop 13D, as well as supplied to this flip-flop 13D. Delay digital signal DG15 is supplied to a second input terminal b of the delay quantity selection circuit 16.

The delay quantity selection circuit 16 selects the first input terminal a or the second input terminal b in response to second selection-control signal CNT2 supplied from the filter circuit 14. As a result, either the delay digital signal DG14 transmitted from the fourth flip-flop 13D or the delay digital signal DG15, which is delayed by the delay time 3T1, which is three times the delay time of DG14, is supplied to the fifth multiplying circuit 15E.

The above-described multiplying circuits 15A to 15E are respectively supplied with coefficient data c20, c21, c22, c23 and c24 from first to fifth coefficient generating circuits 17A to 17E each of which is formed into a ROM (read only memory).

As a result, in the first to the fifth multiplying circuits 15A to 15E, the delay digital signals DG10, D11, DG12, DG13 and DG14 (or DG15) and the corresponding coefficient data c20, c21, c22, c23 and c24 are multiplied together. The results of the multiplications are supplied to the input terminals a of a first to a fifth addition input selection circuits 18A to 18E before they are supplied to first to fifth adder circuits 19A to 19E via their output terminals.

A second input terminal b of each of the first to the fifth addition input selection circuits 18A to 18E is grounded. As a result, when the first input terminals a of the first to the fifth addition input selection circuits 18A to 18E are selected in response to third selection control signal CNT3 supplied from the filter control circuit 14, addition digital data DAIN supplied from outside through a second input terminal 11*c* and results of multiplications supplied from the first to the fifth multiplying circuits 15A to 15E are fully added to one another. The results of this are, as output digital signal DGOUT, transmitted through a second output terminal 11*d*.

When the second input terminals b of the first to the fifth addition input selection circuits 18A to 18E are selected in response to the third selection control signal CNT3, data denoting a value of "0" is supplied to the first to the fifth adder circuits 19A to 19E from the first to the fifth addition input selection circuits 18A to 18E. As a result, the addition digital data DAIN supplied from outside is, as it is, transmitted as the output digital filtered signal DGOUT.

In the oversampling filter 11 according to this mode, coefficient data c20 to c24 each of which is composed of 506 coefficients are stored in the storage region of the ROM of each of the first to the fifth coefficient generating circuits 17A to 17E. Each of the coefficients are arranged to be selected and transmitted at the predetermined delay time T1.

In actual fact, in the oversampling filter 11 according to this mode, ROM mode data DTROM for instructing the read region of the ROMs of the coefficient generating circuits 17A to 17E in accordance with the operational mode and address data DTADR for instructing the reading timing of the ROM in response to clock signals are supplied to the filter circuit 14 and address generating circuits 20A to 20E.

The address generating circuits 20A to 20E generate read address data ADR0 to ADR4 which correspond to ROM mode data DTROM and address data DTADR so as to supply them to the first to the fifth coefficient generating circuits 17A to 17E.

Thus, coefficient data c20 to c24 written in the coefficient generating circuits 17A to 17E are read in accordance with read address data ADR0 to ADR4 supplied from the corresponding address generating circuits 20A to 20E.

The filter control circuit 14 detects the operation mode which denotes how to control the overall body of the oversampling filter 11 in accordance with ROM mode data DTROM, address data DTADR and control data DTCNT which has been set and supplied.

As a result, in accordance with the above-described operation mode, the filter control circuit 14 generates first, second and third selection control signals CNT1, CNT2 and CNT3 which respectively control the delay input selection circuit 12, the delay quantity selection circuit 16 and the first to the fifth addition input selection circuits 18A to 18E. As a result, the operation mode for the overall body of the oversampling filter 11 can be controlled.

The bidirectional sampling rate converting apparatus according to the present invention is constituted by the four oversampling filters 11 each of which is, as shown in FIG. 4, formed into an integrated circuit. Next, the overall structure will be described.

Referring to FIGS. 3 and 4, the first and the second oversampling filters 11A and 11B are serially connected to each other and the third and the fourth oversampling filters 11C and 11D are connected in the same manner. As a result, digital signal SIN10, which is the subject of the sampling rate conversion, is, as the input digital signal DGIN, supplied to the first input terminals 11*a* of the first and the third oversampling filters 11A and 11C.

The second input terminals 11*c* of the first and the third oversampling filters 11A and 11C are grounded. As a result, the value "0" is supplied to each of them as the addition digital data DAIN.

The output terminals 11*b* of the first and the third oversampling filters 11A and 11C are respectively connected to the first input terminals 11*a* of the second and the fourth oversampling filters 11B and 11D. Therefore, output delay digital signal DGOUTA and DGOUTC transmitted from the first and the third oversampling filters 11A and 11C are supplied as input digital signal DGIN for the second and the fourth oversampling filters 11B and 11D.

Furthermore, the output terminals 11*d* of the first and the third oversampling filters 11A and 11C are respectively connected to the second input terminals 11*b* of the second and the fourth oversampling filters 11B and 11D. As a result, output digital signals DGOUTA and DGOUTC transmitted from the first and the third oversampling filters 11A and 11C are supplied as addition digital data DAIN for the second and the fourth oversampling filters 11B and 11D.

The serially connected first and the second oversampling filters 11A and 11B and the third and the fourth oversampling filters 11C and 11D, as a whole, constitute the oversampling filter which is composed of the FIR type digital filter and the length of which is 4554-order.

As a result, output digital signals DGOUTB and DGOUTD transmitted from the second and the fourth oversampling filters 11B and 11D are supplied to an adder circuit 21. As a result, an additional signal thus-obtained is transmitted as digital signal SOUT10 after the rate has been converted.

As a result of the overall structure, the sampling rate converting apparatus 10 according to the present invention is able to selectively convert the sampling rate from input data in the D-1 format into output data in the D-2 format and as well as from input data in the D-2 format into output data in the D-1 format.

The operation of the sampling rate converting apparatus to convert the rate from the D-1 format into the D-2 format and the operation of the same to convert the rate from the D-1 format into the D-1 format will now be described. The basic structure of the oversampling filter for performing the rate conversion operation employs the portion constituted by serially connecting the upper two oversampling filters 11A and 11B shown in FIG. 3 when the rate conversion from the D-1 format to the D-2 format is performed. On the other hand, when the rate conversion from the D-2 format to the D-1 format is performed, a structure constituted by connecting all of the oversampling filters 11A to 11D is employed. The above-described structures are switched over in response to the selection control signals CNT1, CNT2 and CNT3 formed in the above-described filter control circuit 14.

Figure 5:
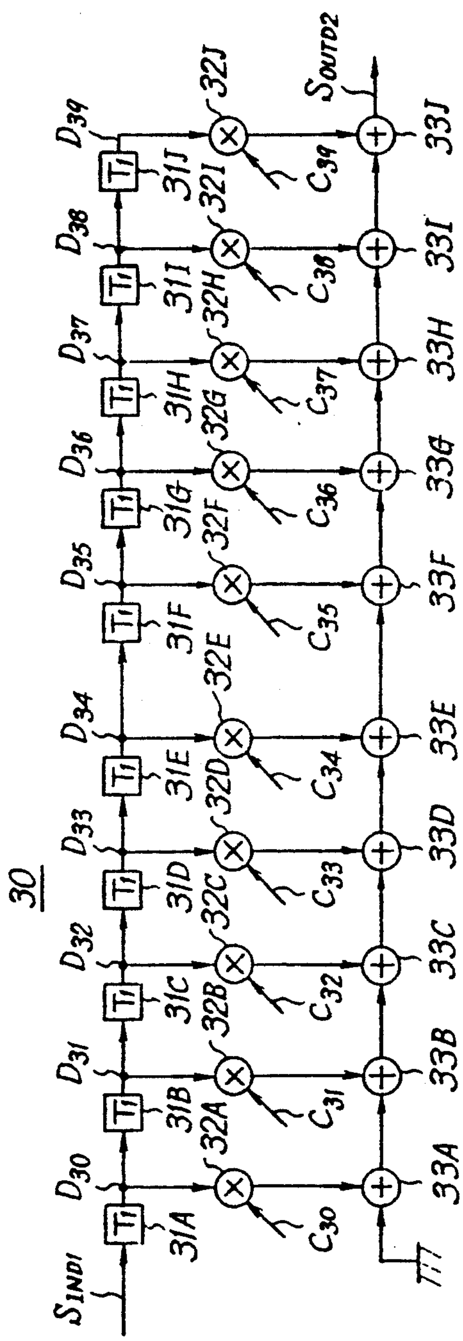
FIG. 5 is a block diagram which illustrates an equivalent circuit for use in a case where the sampling frequency of a 625/50 component digital video signal is converted into a sampling frequency which corresponds to a PAL composite digital video signal.

(2-3) Operation at the Time of Converting the Rate From D-1 Format to D-2 Format Referring to FIG. 5, reference numeral 30 represents, by an equivalent circuit, the overall body of the sampling rate converting apparatus for use when the rate of the sampling frequency of the 625/50 component digital video signal formed in accordance with the D-1 format is, by using the above-described bidirectional sampling rate converting apparatus 10 (refer to FIG. 3), converted into a sampling frequency which corresponds to the PAL composite digital video signal formed in accordance with the D-2 format.

That is, the first input terminal a of the switch circuit 12D of each delay input selection circuit 12 of the serially-connected first and the second oversampling filters 11A and 11B is selected in response to the first selection control signal CNT1 transmitted from the filter control circuit 14.

The first input terminal a of each of the delay quantity selection circuits 16 is selected in response to the second selection control signal CNT2 transmitted from the filter circuit 14. Furthermore, the first input terminal a of each of the first to the fifth addition input selection circuits 18A to 18E is selected in response to the third selection control signal CNT3 transmitted from the filter circuit 14.

On the other hand, the second input terminal b of each of the first to the fifth addition input selection circuits 18A to 18E of the serially connected third and fourth oversampling filters 11C and 11D is selected in response to the third selection control signal CNT3 transmitted from the filter control circuit 14.

As described above, the sampling rate converting apparatus 30 is constituted by the FIR type digital filter which controls the third and the fourth oversampling filters 11C and 11D in such a manner that they are inhibited, that is, not operated, which uses the first and the second oversampling filters 11A and 11B and the length of which is 9 orders (since the final stage multiplication is not performed as described later, the length is 9 orders although the circuit structure has 10 orders).

Therefore, the transmitted 625/50 component digital video signal SIND1 is sequentially supplied to 10 flip-flops 31A to 31J each of which has the predetermined delay time T1. Output digital signals D30 to D39 from the flip-flops 31A to 31I are supplied to ensuing flip-flops 31B to 31J.

Simultaneously, output digital signals D30 to D39 from the flip-flops 31A to 31J are multiplied by predetermined coefficients C30 to C39 in multiplying circuits 32A to 32J before all of the results of the multiplications are added in adder circuits 33A to 33J. Thus, the sampling frequency of the 625/50 component digital video signal SIND1 is rate-converted so that digital signal SOUTD2 which corresponds to the sampling frequency of the PAL composite digital video signal is obtained.

The coefficient c39 supplied to the final multiplying circuit 32J is set to be a value of "0", while, as shown in FIGS. 6(a) and 6(B), the other coefficients c30 to c38 supplied to the other multiplying circuits 32A to 32I use the coefficient data c20 to c24 composed of 506 coefficients and stored in the ROM region of each of the coefficient generating circuits 17A to 17E (refer to FIG. 4) of the first and the second oversampling filters 11A and 11B at every predetermined delay time t1.

Since the coefficient data c20 to c24 composed of 506 coefficients are supplied at every predetermined delay time T1 as described above, the 625/50 component digital video signal SIND1 is oversampled at a frequency which is 506 times its frequency. Furthermore, it can be resampled at a frequency of 1/414 times of it by supplying a predetermined coefficient which is generated at the timing of the frequency which is 1/414 times the above-described oversampling frequency.

As described above, the sampling rate converting apparatus 30 constitutes a 4554-order (9 orders×506 times) oversampling filter capable of oversampling the input 625/50 component digital video signal SIND1 at a frequency which is 506 times its frequency and resampling the above-described oversampling frequency at a frequency which is 1/414 times the oversampling frequency.

According to the structure shown in FIG. 5, the sampling rate converting apparatus 30 can be realized with which the digital signal SOUTD2 which corresponds to the sampling frequency of the PAL composite digital video signal can be obtained by rate-converting the sampling frequency of the 625/50 component digital video signal SIND1.

(2-4) Operation at the Time of Rate-Converting from D-2 Format to D-1 Format

Figure 7:
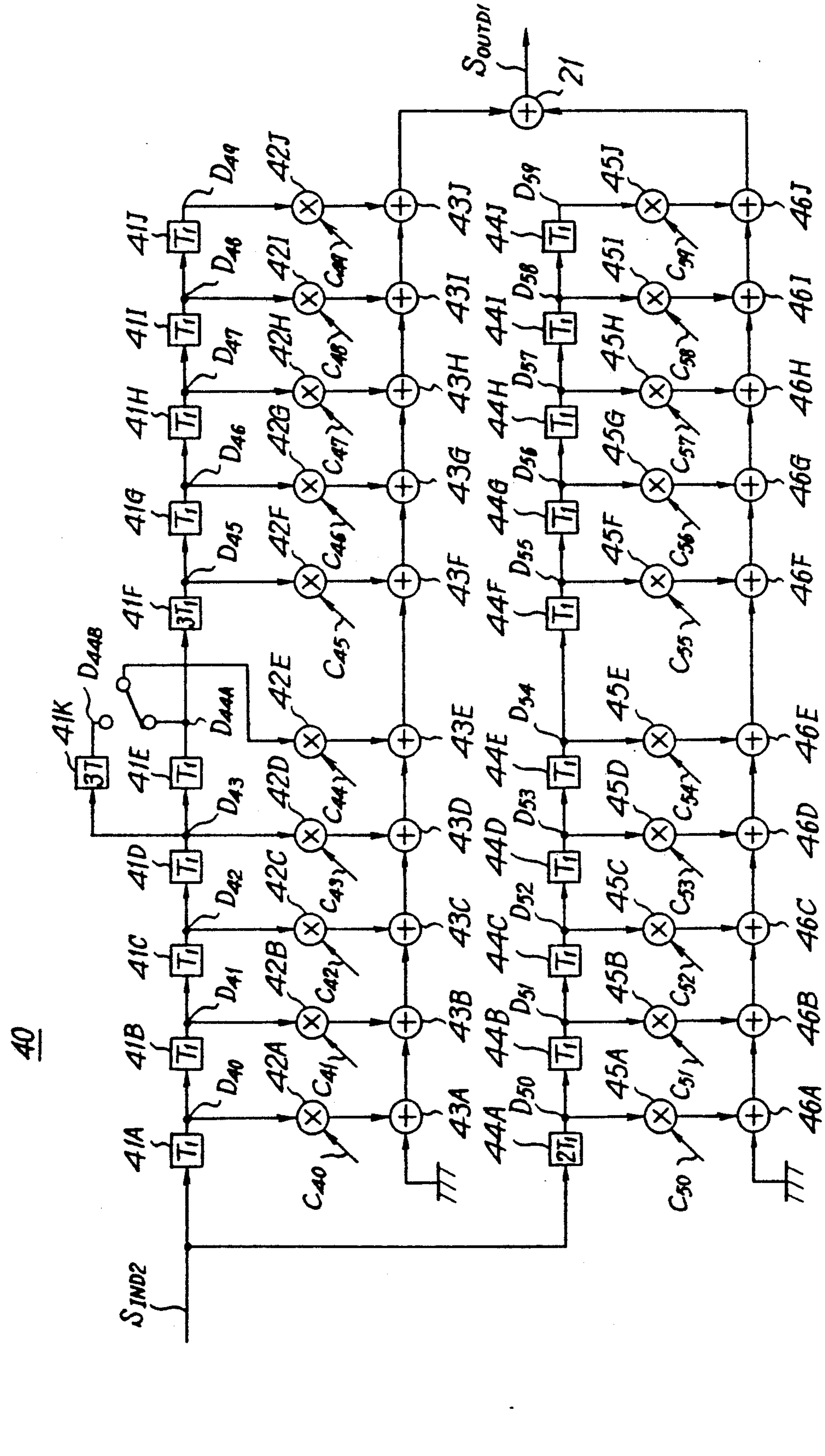
FIG. 7 is a block diagram which illustrates an equivalent circuit for use in a case where the sampling frequency of a PAL composite digital video signal is converted into a sampling frequency which corresponds to a 625/50 component digital video signal.

Referring to FIG. 7, reference numeral 40 represents, by an equivalent circuit, the overall body of the sampling rate converting apparatus for use when the rate of the sampling frequency of the PAL composite digital video signal formed in accordance with the D-2 format is, by using the above-described bidirectional sampling rate converting apparatus 10 (refer to FIG. 3), converted into a sampling frequency which corresponds to the 625/50 component digital video signal formed in accordance with the D-1 format.

In the case of the oversampling filter 40, a first input terminal a of the switch circuit 12D of the delay input selection circuit 12 of the first oversampling filter 11A is, as shown in FIGS. 3 and 4, selected in response to the first selection control signal CNT1 transmitted from the filter control circuit 14. The first or the second input terminal a or b of the delay quantity selection circuit 16 is switched over at a predetermined timing which corresponds to the second selection control signal CNT2.

The third input terminal c of the switch circuit 12D of the delay input selection circuit 12 of the second oversampling filter 11B is selected in response to the first selection control signal CNT1 transmitted from the filter circuit 14. Furthermore, the first input terminal a of the delay quantity selection circuit 16 is selected in response to the second selection control signal CNT2.

Furthermore, the second input terminal b of the switch circuit 12D of the delay input selection circuit 12 of the third oversampling filter 11C is selected in response to the first selection control signal CNT1 transmitted from the filter control circuit 14. In addition, the first input terminal a of the delay quantity selection circuit 16 is selected in response to the second selection control signal CNT2.

Furthermore, the first input terminal a of the switch circuit 12D of the delay input selection circuit 12 of the fourth oversampling filter 11D is selected in response to the first selection control signal CNT1 transmitted from the filter control circuit 14. In addition, the first input terminal a of the delay quantity selection circuit 16 is selected in response to the second selection control signal CNT2.

The first input terminals a of the first to the fifth addition input selection circuits 18A to 18E of the first to the fourth oversampling filters 11A to 11D are selected in response to the selection control signal CNT3 transmitted from each of the filter control circuits 14.

The sampling rate converting apparatus 40 operates the third and the fourth oversampling filters 11C and 11D at timing which is delayed by the predetermined delay time T1 with respect to the first and the second oversampling filters 11A and 11B. Furthermore, it adds the digital outputs from them so that an 11-order FIR type digital filter is, as the whole, constituted.

Therefore, the PAL composite digital video signal SIND2 is, in an equivalent manner, supplied to the serially-connected circuits respectively composed of 10 flip-flops 41A to 41J and 44A to 44J.

Each of the flip-flops 41A to 41J is selected to have the predetermined delay time T1 and the output digital signals D40 to D49 from the corresponding flip-flops 41A to 41J are supplied to the ensuing flip-flops 41B to 41J.

Simultaneously, the output signals D40 to D49 from the corresponding flip-flops 41A to 41J are multiplied with predetermined coefficients c40 to c49 in multiplying circuits 42A to 42J before they are added to one another in the adder circuits 43A to 43J. The results of the additions are supplied to the adder circuit 21.

The output digital signal D44 to be supplied to a fifth multiplying circuit 42E is selected from an output digital signal D44A transmitted from a fifth flip-flop 41E by the delay quantity selection circuit 16 or the output digital signal D44B of a first flip-flop 41K so as to be supplied.

The output digital signal D44A transmitted from the fifth flip-flop 41E is delayed from the output digital signal D43 transmitted from the fourth flip-flop 41D by the predetermined delay time T1.

Output digital signal D44B a from an eleventh flip-flop 41K is delayed from the output digital signal D44A transmitted from the fifth flip-flop 41E by delay time 3T1 which is three times that of the output digital signal D44A.

On the other hand, the first flip-flop 44A of the flip-flops 44A to 44J has the delay time 2T1 which is the twice the delay time of the other flip-flops. Furthermore, each of the second to the tenth flip-flops 44B to 44J has the predetermined delay time T1. In addition, output digital signals D50 to D59 from the corresponding flip-flops 44A to 44J are supplied to the ensuing flip-flops 44B to 44J.

Simultaneously, the output digital signals D50 to D59 from the corresponding flip-flops 44A to 44J are multiplied with predetermined coefficients c50 to c59 in multiplying circuits 45A to 45J before they are added to one another in adder circuits 46A to 46J. The results of the additions are supplied to the adder circuit 21.

Thus, the sampling frequency of the PAL composite digital video signal SIND2 is rate-converted so that the digital signal SOUTD1 having a sampling frequency which corresponds to the 625/50 component digital video signal is obtained.

In the case of this mode, the coefficients c40 to c49 to be supplied to the upper multiplying circuits 42A to 42J comprise data c20 to c24 for 506 coefficients stored in the ROM regions of the coefficient generating circuits 17A to 17E (refer to FIG. 4) of the first and the second oversampling filters 11A and 11B at predetermined delay time T1.

The similar structures of the coefficient generating circuits 17A to 17E of the first and the second oversampling filters 11A and 11B are used when the rate conversion from the D-1 format to the D-2 format is performed.

As shown in FIGS. 6(C) and 6(E), the coefficients respectively allocated to the multiplying circuits 42A to 42J are arranged as follows: as the coefficient c40 to be supplied to the first multiplying circuit 42A, 414 coefficients from the 0-th to 413-th coefficients in the coefficient data c20 for 506 coefficients are supplied, while the 414-th to the 505-th coefficients are not supplied but a value of "0" is supplied as an alternative to this.

As the coefficient c41 to be supplied to the second multiplying circuit 42B, 322 coefficients from the 0-th to 321-th coefficients in the coefficient data c21 for 506 coefficients are supplied, while the 322-th to the 505-th coefficients are not supplied but a value of "0" is supplied as an alternative to this.

As the coefficient c42 to be supplied to the third multiplying circuit 42C, 230 coefficients from the 0-th to 229-th coefficients in the coefficient data c22 for 506 coefficients are supplied, while the 230-th to the 505-th coefficients are not supplied but a value of "0" is supplied as an alternative to this.

As the coefficient c43 to be supplied to the fourth multiplying circuit 42D, 138 coefficients from the 0-th to 137-th coefficients in the coefficient data c23 for 506 coefficients are supplied, while the 138-th to the 505-th coefficients are not supplied but a value of "0" is supplied as an alternative to this.

As the coefficient c44 to be supplied to the fifth multiplying circuit 42E, 46 coefficients from the 0-th to 45-th coefficients in the coefficient data c24 for 506 coefficients and 46 coefficients from the 460-th to 505-th coefficients are supplied, while the 46-th to the 459-th coefficients are not supplied but a value of "0" is supplied as an alternative to this.

As the coefficient c45 to be supplied to the sixth multiplying circuit 42F, 138 coefficients from the 368-th to 505-th coefficients in the coefficient data c21 for 506 coefficients are supplied, while the 0-th to the 367-th coefficients are not supplied but a value of "0" is supplied as an alternative to this.

As the coefficient c46 to be supplied to the seventh multiplying circuit 42G, 230 coefficients from the 276-th to 505-th coefficients in the coefficient data c22 for 506 coefficients are supplied, while the 0-th to the 275-th coefficients are not supplied but a value of "0" is supplied as an alternative to this.

As the coefficient c47 to be supplied to the eighth multiplying circuit 42H, 322 coefficients from the 184-th to 505-th coefficients in the coefficient data c23 for 506 coefficients are supplied, while the 0-th to the 183- th coefficients are not supplied but a value of "0" is supplied as an alternative to this.

As the coefficient c48 to be supplied to the ninth multiplying circuit 42I, 414 coefficients from the 92-th to 505-th coefficients in the coefficient data c24 for 506 coefficients are supplied, while the 0-th to the 91-th coefficients are not supplied but a value of "0" is supplied as an alternative to this.

All of the coefficients c49 to be supplied to the tenth multiplying circuit 42J are determined to be a value of "0".

Figure 6:
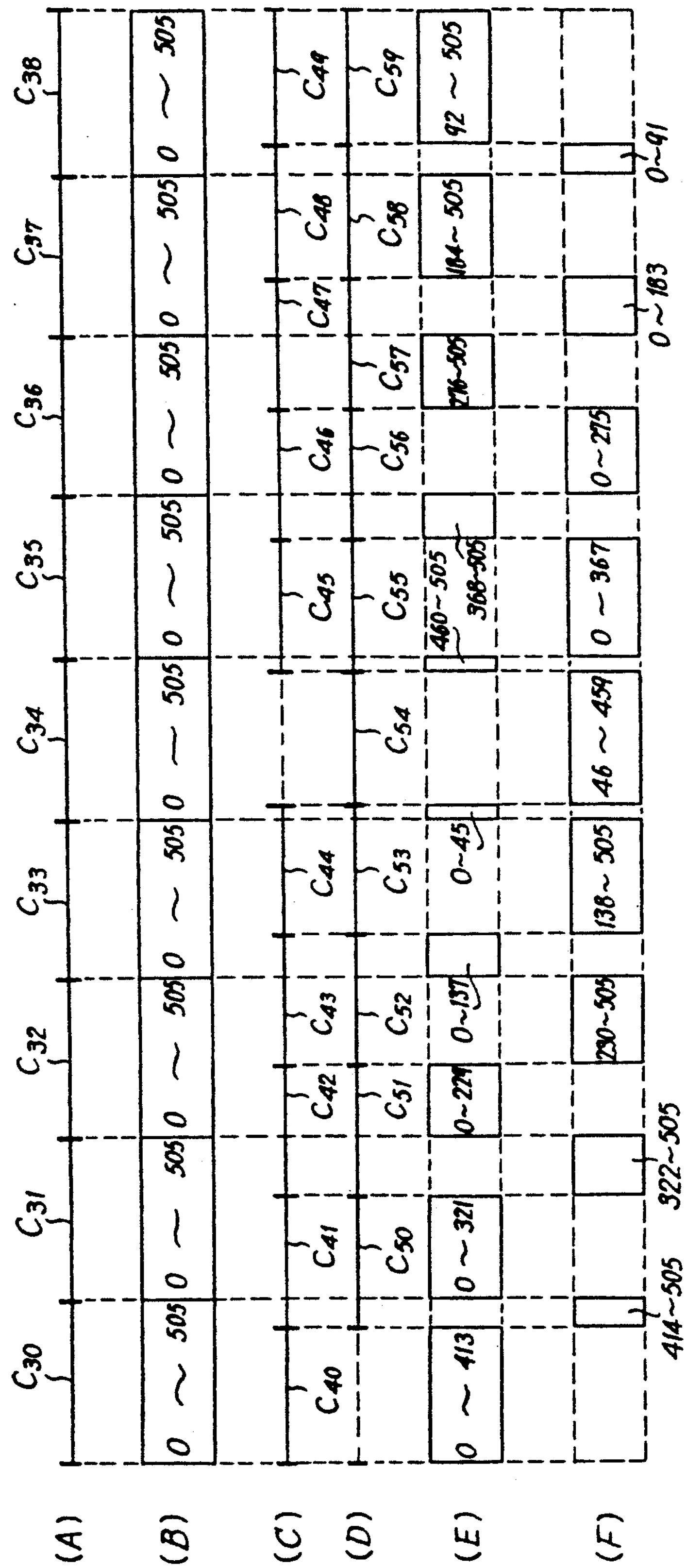
FIG. 6 is a timing chart which illustrates the supply order of coefficient data items.

As shown in FIGS. 6 (D) and (F), as the coefficients c50 to c59 to be supplied to the lower multiplying circuits 45A to 45J, the coefficient data c20 to c24 for 506 coefficients stored in the ROM regions of the coefficient generating circuits 17A to 17E of the third to the fourth oversampling filters 11C and 11D at every predetermined delay time T1 are respectively supplied.

The coefficients to be supplied to each of the multiplying circuits 45A to 45J are as follows:

In actual fact, as the coefficient c50 to be supplied to the first multiplying circuit 45A, 92 coefficients from the 414-th to 505-th coefficients in the coefficient data c20 for 506 coefficients are supplied, while the 0-th to the 413-th coefficients are not supplied but a value of "0" is supplied as an alternative to this.

As the coefficient c51 to be supplied to the second multiplying circuit 45B, 184 coefficients from the 322-th to 505-th coefficients in the coefficient data c21 for 506 coefficients are supplied, while the 0-th to the 321-th coefficients are not supplied but a value of "0" is supplied as an alternative to this.

As the coefficient c52 to be supplied to the third multiplying circuit 45C, 276 coefficients from the 230-th to 505-th coefficients in the coefficient data c22 for 506 coefficients are supplied, while the 0-th to the 299-th coefficients are not supplied but a value of "0" is supplied as an alternative to this.

As the coefficient c53 to be supplied to the fourth multiplying circuit 45D, 368 coefficients from the 138-th to 505-th coefficients in the coefficient data c23 for 506 coefficients are supplied, while the 0-th to the 137-th coefficients are not supplied but a value of "0" is supplied as an alternative to this.

As the coefficient c54 to be supplied to the fifth multiplying circuit 45E, 414 coefficients from the 46-th to 459-th coefficients in the coefficient data c24 for 506 coefficients are supplied, while the 0-th to the 45-th and the 460-th to the 505-th coefficients are not supplied but a value of "0" is supplied as an alternative to this.

As the coefficient c55 to be supplied to the sixth multiplying circuit 45F, 368 coefficients from the 0-th to 367-th coefficients in the coefficient data c20 for 506 coefficients are supplied, while the 368-th to the 505-th coefficients are not supplied but a value of "0" is supplied as an alternative to this.

As the coefficient c56 to be supplied to the seventh multiplying circuit 45G, 276 coefficients from the 0-th to the 275-th coefficients in the coefficient data c21 for 506 coefficients are supplied, while the 276-th to the 505-th coefficients are not supplied but a value of "0" is supplied as an alternative to this.

As the coefficient c57 to be supplied to the eighth multiplying circuit 45H, 184 coefficients from the 0-th to 183-th coefficients in the coefficient data c22 for 506 coefficients are supplied, while the 184-th to the 505-th coefficients are not supplied but a value of "0" is supplied as an alternative to this.

As the coefficient c58 to be supplied to the ninth multiplying circuit 45I, 92 coefficients from the 0-th to 91-th coefficients in the coefficient data c23 for 506 coefficients are supplied, while the 92-th to the 505-th coefficients are not supplied but a value of "0" is supplied as an alternative to this.

All of the coefficients c59 to be supplied to the tenth multiplying circuit 42J are set to a value of "0".

The timing of each of coefficient data and the flip-flop outputs, which are multiplied by each of the multiplying circuits 42A to 42J and 45A to 45J, must be considered. The reason for this lies in that the deviation takes place between coefficient data and sampling data transferred by the flip-flop because 506 coefficients stored in each of the coefficient generating circuits are commonly used to rate-convert the D-1 format into the D-2 format and to rate-convert the D-2 format into the D-1 format. The above-described deviation can be corrected by aligning the phase of coefficient data to sampling data or by aligning the phase of sampling data to coefficient data. The oversampling filter according to the present invention employs the latter method, that is, the phase of sampling data is aligned to coefficient data.

That is, in the case shown in FIG. 7, the lower oversampling filter is given the delay time of 2T1 in the delay input selection circuit 12 as the delay time for its leading flip-flop 44A. The above-described lower oversampling filter multiplies sampling data delayed by 1 delay time interval by coefficient data c50 to c59. The multiplying circuits 42A to 42D of the upper oversampling filter as it is multiply input sampling data by coefficient data c40 to c43. In this case, the multiplying circuit 42E must perform the multiplications of the 0-th to the 45-th coefficients and perform multiplications of data obtained by delaying sampling data used in the above-described multiplications by 2 additional delay time intervals by the 460-th to 505-th coefficients. Therefore, the timing of sampling data supplied to the multiplying circuit 42E is delayed by the delay time T1 or 3T1 in the delay quantity selection circuit 16 before it is multiplied by coefficient c44.

Coefficient data c45 to c49 are deviated by 2 delay time intervals from sampling data. Therefore, a further delay time of 2T1 is given in the delay input selection circuit 12. It corresponds to the flip-flop 41F.

As described above, the oversampling filter according to the present invention is arranged in such a manner that coefficient data for 506 coefficients are combined in units of 414 coefficients to supply them to the multiplying circuits 42A to 42J and 45A to 45J as coefficient data c40 to c49 and c50 to c59 every predetermined delay time T1. Therefore, as a whole, the 4554-order (11-order×414 times) oversampling filter is constituted which is capable of oversampling the supplied PAL composite digital video signal SIND2 at a frequency which is 414 times its frequency and as well as resampling it at a frequency which is 1/506 times the oversampling frequency.

According to the structure shown in FIG. 7, the sampling rate converting apparatus 40 can be realized which is capable of obtaining the digital signal SOUTD1 which corresponds to the sampling frequency of the 625/50 component digital video signal by rate-converting the sampling frequency of the PAL composite digital video signal SIND2.

(2-5) Effects of the Second Mode

According to the above-described structure, the oversampling filters formed into the FIR type digital filters each of which is able to select the coefficient to be supplied to the multiplying circuit are combined to one another so as to supply the predetermined coefficient to each of the oversampling filters in accordance with the sampling rate conversion direction between the 625/50 component digital video signal and the PAL composite digital video signal. As a result, a bidirectional sampling rate converting apparatus can be realized which is capable of converting the sampling frequency of the 625/50 component digital video signal into the sampling frequency which corresponds to the PAL composite digital video signal and as well as capable of converting the sampling frequency of the PAL composite digital video signal into the sampling frequency which corresponds to the 625/50 component digital video signal.

(3) Other Modes (3-1) The above-described first mode is arranged in such a manner that the frequency ratio of the sampling frequencies of the digital signals which are the subject of the rate conversion is determined to be 3:4 and the sampling rate is converted in the two opposing directions by using the oversampling filter the length of which is 12 orders. The present invention is not limited to this. A similar effect to that obtainable from the above-described first mode can be obtained in a case where the frequency ratio of the sampling frequencies has a simple integral proportional relationship by arranging the structure in such a manner that a sampling filter the length of which corresponds to the least common multiple of the frequency ratio is constituted.

(3-2) According to the above-described second mode, the oversampling filter the length of which is 4554 orders is used for approximation from the relationship of the frequency ratio of the sampling frequency of the 625/50 component digital video signal and the sampling frequency of the PAL composite digital video signal so that the sampling rate is converted in the two opposing directions. However, the present invention is not limited to this. The present invention can be applied widely when the sampling rate is converted between the sampling frequency of a variety of digital signals and other sampling frequencies in the two opposing directions. In this case, the length of the oversampling filter may be determined in accordance with this.

(3-3) According to the above-described second mode, the sampling rate converting apparatus is constituted by combining four FIR type digital filters each of which is formed into an integrated circuit and the length of each which is five orders. The structure of the sampling rate converting apparatus is not limited to this. A variety of structures can be employed to form the sampling rate converting apparatus. For example, a structure which is arranged in such a manner that the overall body is formed into an integrated circuit can be employed. In this case, a similar effect can be obtained to that obtainable from the above-described modes.

Although illustrative embodiments of the present invention, and various modifications thereof, have been described in detail herein with reference to the accompanying drawings, it is to be understood that the invention is not limited to these precise embodiments and the described modifications, and that various changes and further modifications may be effected therein by one skilled in the art without departing from the scope or spirit of the invention as defined in the appended claims.

What is claimed is:

1. A sampling rate converting apparatus for converting an input digital signal which is sampled with one of a first sampling frequency and a second sampling frequency into an output digital signal sampled with the other of said first sampling frequency and said second sampling frequency, with a frequency ratio of said first sampling frequency and said second sampling frequency having a numerator and a denominator which are respective integer values, said sampling rate converting apparatus comprising:

a number of delay means connected in series for each delaying a sample of said input digital signal and thereby producing a respective delayed signal;

coefficient receiving means for receiving a plurality of coefficients;

a number of multipliers each receiving a delayed signal from a respective one of said delay means and a coefficient from said coefficient receiving means for producing a respective multiplied signal; and means for adding the multiplied signals respectively produced by said multipliers and thereby producing said output digital signal;

wherein said number of said delay means and said number of multipliers are each based on the product of said numerator and said denominator of said frequency ratio.

2. A sampling rate converting apparatus according to claim 1, wherein selected coefficients of said plurality of coefficients each have a value of zero and said selected coefficients are respectively supplied to certain of said multipliers based on whether said input digital signal is sampled with said first sampling frequency or said second sampling frequency.

3. A sampling rate converting filter for converting an input digital signal which is sampled with one of a first sampling frequency and a second sampling frequency into an output digital signal sampled with the other of said first sampling frequency and said second sampling frequency, said first and second sampling frequencies lacking a simple integral relationship:

said filter having an order based on the least common multiple of respective approximate oversampling frequency factors of said first and second sampling frequencies; and said filter comprising a plurality of oversampling filters each including: a plurality of delay means connected in series, each of said delay means delaying a sample of said input digital signal for producing a respective delayed signal, coefficient generating means for generating a plurality of coefficients and for supplying selected ones of said coefficients based on the sampling frequency of said input digital signal, weighting means for multiplying each of the respective delayed signals by respective selected ones of said coefficients to produce a plurality of weighted signals, and means for adding said plurality of weighted signals to produce a respective filtered signal; and means for combining the respective filtered signals from said oversampling filters to produce said output digital signal.

4. A sampling rate converting filter according to claim 3, wherein said coefficient generating means comprises a plurality of memories for each storing a number of said coefficients which corresponds to the largest of said respective approximate oversampling frequency factors and wherein said coefficients are used both when said first sampling frequency is rate-converted into said second sampling frequency and when said second sampling frequency is rate-converted into said first sampling frequency.

5. A sampling rate converting filter according to claim 3, wherein each of said plurality of oversampling filters includes the same coefficients.

6. A sampling rate converting filter according to claim 5, wherein at least one of said delay means in each of said oversampling filters delays a sample of said input signal by a delay time determined in response to a first control signal.

7. A sampling rate converting filter according to claim 5, wherein each of said plurality of said oversampling filters further includes selection control means for inhibiting said filtered signal in accordance with a second control signal.

8. A sampling rate converting filter according to claim 5, wherein a first set of said plurality of said oversampling filters is used for rate-converting said first sampling frequency into said second sampling frequency and a second set of said plurality of said oversampling filters is used for rate-converting said second sampling frequency into said first sampling frequency.

* * * * *